United States Patent
Van Den Brink

(10) Patent No.: US 8,744,154 B2
(45) Date of Patent: Jun. 3, 2014

(54) SYSTEM AND METHOD FOR ACQUIRING MAGNETIC RESONANCE IMAGING (MRI) DATA

(75) Inventor: Johan Samuel Van Den Brink, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1180 days.

(21) Appl. No.: 12/067,393

(22) PCT Filed: Sep. 22, 2006

(86) PCT No.: PCT/IB2006/053431
§ 371 (c)(1), (2), (4) Date: Mar. 19, 2008

(87) PCT Pub. No.: WO2007/036857
PCT Pub. Date: Apr. 5, 2007

(65) Prior Publication Data
US 2008/0253639 A1    Oct. 16, 2008

(30) Foreign Application Priority Data
Sep. 29, 2005   (EP) .................................. 05109004

(51) Int. Cl.
*A61B 5/055*   (2006.01)

(52) U.S. Cl.
USPC .......................................... 382/131; 600/410

(58) Field of Classification Search
USPC .................................. 382/128, 131; 600/410
See application file for complete search history.

(56) References Cited

U.S. PATENT DOCUMENTS

| 6,898,302 | B1 * | 5/2005 | Brummer ....................... 382/131 |
| 7,734,075 | B2 * | 6/2010 | Sun et al. ....................... 382/128 |
| 7,903,852 | B2 * | 3/2011 | Springorum et al. ......... 382/128 |
| 8,121,361 | B2 * | 2/2012 | Ernst et al. .................... 382/128 |
| 2001/0020127 | A1 * | 9/2001 | Oshio et al. ................... 600/429 |

(Continued)

FOREIGN PATENT DOCUMENTS

| CA | 2473963 A1 | 1/2005 |
| NL | 31229 | 11/1933 |
| WO | 0184172 A1 | 11/2001 |
| WO | 2004052206 A1 | 6/2004 |

OTHER PUBLICATIONS van der Kouwe, A., "On-Line Automatic Slice Positioning and Between-Scan Correction for Brain MR Protocals" Proc. Intl. Soc. Mag. Reson. Med. 11 (2003).*

(Continued)

*Primary Examiner* — David A Vanore
*Assistant Examiner* — Wyatt Stoffa

(57) ABSTRACT

A method for acquiring image data from a patient with a magnetic resonance imaging (MRI) system. The proposed method comprises the steps of: a) predefining a number of scan geometries for acquiring the image data from at least one region of interest (ROI) relative to the patient, b) performing at least one scan for acquiring the image data in accordance with at least one of the predefined scan geometries, c) analysing in the image data a position of the region of interest to detect a deviation from the at least one predefined scan geometry, d) changing the at least one predefined scan geometry if said deviation exceeds a predetermined threshold value, and e) repeating steps b) to d) until a predetermined number of scans has been performed. Thus, by means of the proposed method the utility of such predefined scan geometries is greatly enhanced.

15 Claims, 3 Drawing Sheets

(56) References Cited

U.S. PATENT DOCUMENTS

| | | | |
|---|---|---|---|
| 2002/0156363 A1* | 10/2002 | Hunter et al. | 600/410 |
| 2002/0198447 A1* | 12/2002 | Van Muiswinkel et al. | 600/410 |
| 2004/0114791 A1* | 6/2004 | Atkinson | 382/131 |
| 2005/0054910 A1* | 3/2005 | Tremblay et al. | 600/411 |
| 2005/0070784 A1* | 3/2005 | Komura et al. | 600/410 |
| 2005/0154292 A1* | 7/2005 | Tank | 600/410 |
| 2005/0219241 A1* | 10/2005 | Chun | 345/419 |
| 2006/0111630 A1* | 5/2006 | Netsch et al. | 600/425 |
| 2009/0240136 A9* | 9/2009 | Sun et al. | 600/410 |
| 2010/0189328 A1* | 7/2010 | Boernert et al. | 382/131 |
| 2010/0309198 A1* | 12/2010 | Kauffmann | 345/419 |

OTHER PUBLICATIONS

Welch, E. B., et al.; Interscan Registration Using Navigator Echoes; 2004; MRM; 52:1448-1452.*

Thesen, S., et. al., "Prospective Acquisition Correction for Head Motion with Image-Based Tracking for Real-Time fMRI" Magnetic Resonance in Medicine 44:457-465 (2000).*

Derbyshire, J. A., et al.; Dynamic Scan-Plane Tracking Using MR Position Monitoring; 1998; JMRI; 8(4)924-932.

Gedat, E., et al.; Prospective Registration of Human Head Magnetic Resonance Images for Reproducible Slice Positioning Using Localizer Images; 2004; JMRI; 20:581-587.

Itti, L., et al.; Automatic Scan Prescription for Brain MRI; 2001; MRM; 45:486-494.

Lam, S. T., et al.; Detection and correction of patient movement in prostate brachytherapy seed reconstruction; 2005; Phys. Med. Biol.; 50:abstract.

Manke, D., et al.; Novel prospective respiratory motion correction approach for free-breathing coronary MR angiography using a patient-adapted affine motion model; 2003; Magn. Reson. Med.; 50(1)abstract.

Philips Achieva/Intera; Release 1.2/11; product literature; Chapter 8: Scan list: Planning and scanning.

Thesen, S., et al.; Prospective Acquisition Correction for Head Motion with Image-Based Tracking for Real-Time fMRI; 2000; MRM; 44:457-465.

van der Kouwe, A., et al.; On-Line automatic slice positioning and between-scan correction for brain MR protocols; 2003; Proc. Intl. Soc. Mag. Reson. Med.; 11:797.

* cited by examiner

SYSTEM AND METHOD FOR ACQUIRING MAGNETIC RESONANCE IMAGING (MRI) DATA

TECHNICAL FIELD OF THE INVENTION

The present invention relates generally to Magnetic Resonance Imaging (MRI). More specifically, the present invention relates to a method and a system for acquiring MR image data from a patient using predefined scan geometries.

BACKGROUND OF THE INVENTION

Utilising nuclear magnetic resonance (NMR) has become a standard procedure for noninvasively acquiring image data from inside a patient's body, e.g. the brain, by means of clinical MRI equipment. In this context, a technique using magnetic field gradients is employed which permits to obtain NMR signals (constituting NMR data) from specific locations in the patient. Typically, the region which is to be imaged (region of interest, ROI) is scanned in planes by a sequence of measurement cycles. The resulting NMR data are digitized and further processed to reconstruct the image using one of a variety of reconstruction techniques known to a person skilled in the art.

Prior art methods and systems have introduced the concept of geometry sharing with so-called "named geometries". In this context, a user of the MRI equipment defines a number of scan plane positions, hereinafter referred to as scan geometries, having a unique identifier, e.g. a name, such as "TRA". Upon acknowledgement of the scan geometry by the user, which is required only once, the system executes all scans with a common geometry, i.e. a common identifier, which accordingly share the same orientation relative to the patient, but usually employ different MR contrast settings. More specifically, in accordance with the known methods as disclosed, e.g., in prior art document NL 031229 C, so-called scout images are acquired first, based on which the user defines the scan geometries. Using said orientations, the MRI system then defines the corresponding scan parameters, e.g. magnetic gradients, and submits a scan to be performed to a dedicated control unit. After acquisition of a particular image frame, the latter is reconstructed and usually written to a database. Then the next scan is submitted, until all scans are finished. In this way, prior art document NL 031229 C discloses the use of "geometry sharing".

However, this approach suffers from the following disadvantage: During routine scanning patients do often move involuntarily. However, the known method and system assumes that patients not move at all, or only in a minimal way, since the scan geometry and the corresponding scan parameters are only defined once, and never updated afterwards. This may cause a geometrical mismatch between the acquired ROI, i.e. a scan slice relative to anatomy, and the intended ROI with respect to subsequent scans, i.e. queued scans ready for dispatching from the scan queue to the scanner, which should ideally share the same geometry. When reading multi-contrast scans, this implies that a radiologic reader has to reorder scans to match geometries, which is a costly and time-consuming process.

Prior art documents WO 01/84172 A1 and CA 2 473 963 A1 tackle the problem of motion correction in connection with MRI techniques such as functional MRI (fMRI), wherein each individual scan is performed as a time series of individual scans which are equal in terms of MR parameters and contrasts, i.e. each scan includes a plurality of separate image frames, and the patient moves between and/or during capture of such image frames. This is also referred to as "time-sliced" image acquisition. To this end, a current patient motion is repeatedly measured during the scan, and at least one scan parameter of an MRI system is adjusted accordingly prior to performing the next scan of the time series. More specifically, as stated before a user defines scan geometries from scout images, which in turn are used to define the scan parameters. Then a (time-sliced) scan is submitted and a given image frame N belonging to that scan is acquired. After reconstruction of said image frame N, the latter is registered versus an image frame N−1 of the same scan that has been acquired earlier in the time series. The registration result is used to derive a transformation matrix T which is used to update the scan parameters for a subsequent image frame N+1. Thus, updating is an exclusively local process, which implies that image registration is performed on frames with similar contrast and involves modification of the RF excitation frequencies and gradient waveforms only. In the context of shared geometries, in this approach there is no relation between subsequent scans (i.e., respective time series) with the same geometry. Again, this may cause a geometrical mismatch between an acquired and an intended ROI for subsequent scans, which should ideally share the same geometry.

Thus, there is a need in the art for a method and a system which ensure that subsequent scans with a common predefined geometry do effectively lead to the acquisition of image data which share a physical geometry relative to a patient.

It is the object of the present invention to provide a method for acquiring image data from a patient with a magnetic resonance imaging (MRI) system which obviates the above-mentioned disadvantages. It is also an object of the present invention to provide magnetic resonance imaging (MRI) system which obviates the disadvantage that subsequent scans with a common "named geometry" effectively acquire data from differing regions in the patient, which usually do not coincide with an intended ROI due to patient motion. Furthermore, the present invention has for its object to provide a computer programme product adapted to translate into action the above-mentioned method in accordance with the present invention.

SUMMARY OF THE INVENTION

According to a first aspect of the invention the object is achieved by providing a method for acquiring image data from a patient with a magnetic resonance imaging (MRI) system, comprising the steps of:
a) predefining a number of scan geometries for acquiring the image data from at least one region of interest relative to the patient,
b) performing at least one scan for acquiring the image data in accordance with at least one of the predefined scan geometries,
c) analysing in the image data a position of the region of interest to detect a deviation from the at least one predefined scan geometry,
d) changing the at least one predefined scan geometry if said deviation exceeds a predetermined threshold value, and
e) repeating steps b) to d) until a predetermined number of scans has been performed.

In this context, the scans to be performed in said step b) can be part of a queue, and the updated geometry is applied to all scans in the queue, which are waiting for submission to the scarce scanner resource. Alternatively, the scans can be validated immediately prior to their execution. Both methods are feasible and comply with the approach according to the present invention while the former may be preferable in practise, as described in cited document NL 031229 C, the contents of which are herewith incorporated by reference in the present specification.

Thus, the general idea of the present invention includes implementing a motion correction between geometry sharing scans in an environment using predefined named scan geometries, which has not been considered before. Highly specific software design measures are required to implement the concept of "geometries" to exist independent from "scan parameters". Additional design measures relate to managing the scan queue, and introducing a database of shared geometries. Furthermore, additional "handles" are required to update the shared geometries in the database. Finally, further measures have to be provided to apply the modified geometries to (all) scans still in the queue. If the concept of a queue of pre-validated scans is used, scans may have, e.g., transversal and sagital "views", respectively, i.e. a plurality of geometries, such that a given change in geometry applies to all of said views.

In accordance with the present invention there is proposed a method for acquiring image data from a patient with a magnetic resonance imaging (MRI) system which basically includes analysing and updating predefined scan geometries which can be repeatedly used to acquire MR image data from a patient. These geometries are defined by the user in accordance with a particular region of interest inside the patient's body. Upon establishment, a number of scans can be performed which all share the same geometry but usually differ in terms of MR parameters and image contrast. However, such geometries are usually established only once during a scan session, i.e. for a series of (possibly individually time-sliced) scans. If the patient moves between scans there would be a mismatch of the actual image acquisition region and the patient's anatomy. Therefore it is proposed to analyse the position of the region of interest upon reconstruction of every scan and to update the scan geometry accordingly prior to the next scan. As stated above, in this context the term "scan" comprises a single image capture pass as well as a time series of individual image capture passes (multiple frame acquisitions, as in fMRI).

Here and in the following specification, the term "position" refers to both orientation and location of the ROI and the patient, respectively.

Correspondingly, the term "patient" is by no means restricted to human beings and encompasses all sorts of examination subjects susceptible to NRM techniques, e.g. biological matter in a broad sense.

The term "geometry" is defined as scan orientation (transversal, coronal, sagital, etc.) and coverage (field-of-view, e.g. 250/300/430 mm, etc.).

Finally, the term "scan" includes both scans including only a single image frame acquisition pass as well as scanning techniques wherein each individual scan is performed as a time series of individual acquisition passes which are equal in terms of MR parameters and contrasts, i.e. each scan includes a plurality of separate image frames. This is also referred to as "time-sliced" image acquisition.

In this way, the proposed method achieves inter-scan prospective motion control which enables widespread use of shared geometries owing to the inventive approach of correcting predefined geometries prior to performing subsequent scans with the same geometry.

According to a second aspect of the invention, the object is also achieved by means of a magnetic resonance imaging (MRI) system, comprising:
   a magnet/coil device for subjecting a patient to a magnetic field and for receiving NMR data from the patient, and
   a control system in connection with the magnet/coil device, said control system further comprising:
   a control unit for controlling the magnet/coil device in accordance with at least one predefined scan geometry for acquiring NMR data from at least one region of interest relative to the patient,
   a geometry unit for predefining the at least one scan geometry and for providing at least one scan geometry to the control unit,
   an image processing unit for converting the NMR data to image data, and
   geometry updating means for updating the at least one predefined scan geometry, to be activated if a position of the region of interest deviates from the at least one predefined scan geometry by a predetermined threshold value.

According to a third aspect of the invention, the object is furthermore achieved by providing a computer programme product for use in a magnetic resonance imaging (MRI) system for acquiring image data from a patient, operable to:
a) predefine a number of scan geometries for acquiring the image data from at least one region of interest relative to the patient,
b) perform at least one scan for acquiring the image data in accordance with at least one of the predefined scan geometries,
c) analyse in the image data a position of the region of interest to detect a deviation from the at least one predefined scan geometry,
d) change the at least one predefined scan geometry if said deviation exceeds a predetermined threshold value, and
e) repeat steps b) to d) until a predetermined number of scans has been performed.

The criterion underlying said threshold value may be referred to as "sufficiently non-zero" transformation matrix T, e.g. involving rotation by an angle $\alpha > 2\text{-}5°$ and/or translation by more than 2-5 mm.

Advantageously, in accordance with a further development of the inventive method it is proposed that the above-defined method step d) comprises the steps of determining a geometry transformation matrix and applying said matrix to the at least one predefined geometry. In this way, by applying the transformation matrix, any number of predefined scan geometries, in particular all predefined geometries can be updated in a given MRI examination context.

According to a variant of the inventive method, the geometry transformation matrix is derived by registering data from a first scan relative to data from a second scan, as described in prior art document WO 2004/052206 A1 the respective disclosure of which is incorporated herein by reference. In a corresponding embodiment of the MRI system according to the present invention there is provided a registration unit adapted to register data from a first scan relative to data from a second scan, and the control system further comprises geometry transformation generating means for deriving from said registration a transformation for use by the geometry updating means in updating the at least one predefined scan geometry. Alternatively, the geometry transformation matrix can be derived by registering data from a scan relative to an anatomical reference, i.e. an anatomical landmark of the patient's body, which can be retrieved easily during comparison of scan images regardless of a variation of MR settings, e.g. contrast. In a corresponding embodiment of the MRI system according to the present invention there is provided a registration unit adapted to register data from a scan relative an anatomical reference, and the control system further comprises geometry transformation generating means for deriving from said registration a transformation for use by the geometry updating means in updating the at least one predefined scan geometry.

To the same end, in another embodiment of the method in accordance with the present invention an anatomy scouting scan is performed prior to the above-defined step a) for detecting anatomical landmarks of the patient, and the region of interest is defined relative to said anatomical landmarks.

Alternatively, a dedicated position detection can be performed in connection with the above-defined step a) for detecting a position of the patient, and the region of interest is defined relative to said patient position. In order to accurately determine the patient's position, which is crucial for correctly defining the ROI and the scan geometries, said dedicated position detection may comprise at least one of using an orbital MR navigator, using fiducial markers, and using external optical detection means, as known to a person skilled in the art. Correspondingly, a further embodiment of the inventive MRI system may comprise dedicated position detection means for detecting a position of the patient.

In a preferred further development of the inventive method, an additional step b') of performing an additional dedicated position detection is inserted in the method flow to provide input data for the position analysis in step c). In this way, the invention does not rely on image registration techniques for detecting a deviation of the ROI from a predefined scan geometry but rather actively performs repeated position measurements for to determine with high accuracy whether or not a predefined scan geometry has to be updated due to patient movement.

In still another embodiment of the method according to the invention it is proposed that the above-defined step c) is performed upon reconstruction of each scan in a set of scans. In this way the inventive method ensures continuous geometry updating which results in an optimum coverage of the intended ROI.

In order to further improve the geometrical accuracy of the proposed MR image acquisition method, according to a further development for scans comprising a time series of image frame acquisitions an additional Prospective Motion Correction (PMC) is performed for at least one scan in the above-defined step b). For instance, this applies to imaging techniques such as diffusion tensor imaging, wherein the same ROI is acquired with multiple contrast settings, so-called "gradient orientations". In a corresponding development, the system in accordance with the present invention may include a Prospective Motion Correction (PMC) unit for updating at least one scan parameter in scans comprising a time series of image frame acquisitions.

Further advantages and characteristics of the present invention can be gathered from the following description of preferred embodiments with reference to the enclosed drawings. The features mentioned above as well as below can be used in accordance with the invention either individually or in conjunction. The embodiments mentioned are not be understood as an exhaustive enumeration but rather as examples with regard to the underlying concept of the present invention.

DETAILED DESCRIPTION

Figure 1:
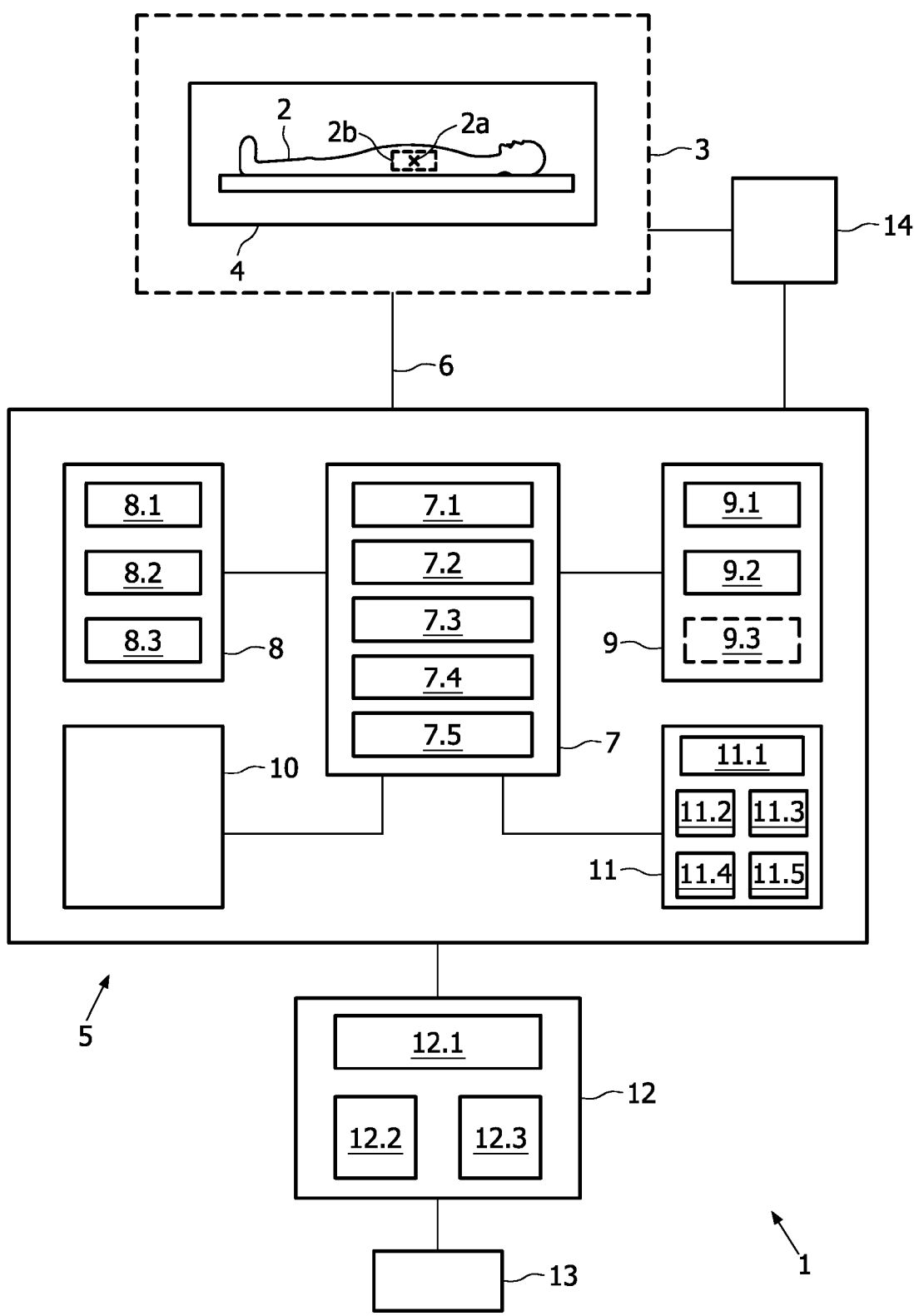
FIG. 1 is a schematic block diagram of an MRI system consistent with the present invention.

The following detailed description of the invention refers to the accompanying drawings. The same reference numerals may be used in different drawings to identify the same or similar elements.

FIG. 1 shows a block diagram of an MRI system 1 for acquiring image data from an examination subject 2, e.g. a patient. The system 1 comprises an MRI examination chamber or magnet room 3, inside which the patient is positioned for examination. Within the examination chamber 3, the system 1 comprises a magnet/coil device 4 arranged around the patient 2. The magnet/coil device 4 includes various functional units (not shown) adapted for subjecting the patient 2 to a specific magic field used to elicit NMR signals from a particular location 2a (denoted "X") inside the patient 2. Said functional units are generally known to a person skilled in the art and regularly comprise polarising magnets, shim coils, RF coils, and gradient coils. Said particular location 2a is usually extended by means of scanning techniques to define a so-called region of interest 2b (ROI) inside the patient 2 from which MR image data are to be collected for a particular examination purpose and which is illustrated by means of a dashed box in FIG. 1.

According to FIG. 1, the examination chamber 3 is connected with a control system 5 by means of a transceiving link 6. On a higher hierarchical level the control system 5 first comprises a control unit 7 for controlling an operation of the examination chamber 3, i.e. the magnet/coil device 4 comprised therein, and for receiving the patient's NMR data, hereinafter also referred to as image data. Furthermore, the control system 5 comprises an image processing unit 8 for processing the image data and a registration unit 9 for image registration, both of which are connected with the control unit 7. The control system 5 also comprises a prospective motion correcting unit 10 (PMC unit) and a geometry unit 11, the latter for defining, storing, and updating predefined scan geometries in accordance with the present invention. Both the PMC unit 10 and the geometry unit 11 are connected with the control unit 7, too. The control system 5 is further connected with a user console 12 for interaction with a user 13.

On a lower hierarchical level, the control system 5 comprises in the control unit 7 a control processor element 7.1, a transceiver element 7.2, a pulse generator element 7.3, a memory element 7.4, and a (gradient) amplifier element 7.5, the function of which is known to a person skilled in the art. By means of the aforementioned elements the control unit 7 controls the operation of the examination chamber 3, e.g. by transmitting RF pulses to the RF coils comprised in the magnet/coil device 4 for generating a specific magnetic field inside the patient 2, and by receiving from the magnet/coil device 4 the NMR signals generated in the ROI 2b. Generally, the operation of the control unit 7 is controlled by the processor element 7.1 in connection with control programmes (not shown) stored in the memory element 7.4, e.g. for modification of the RF pulses and gradient waveforms generated by the pulse generator element 7.3 in operative connection with the gradient amplifier element 7.5, as known to a person skilled in the art. In this way, scans with different MR parameters and contrasts can be performed. A particular example would be T1-TSE, TE 30 ms, TR 500 ms, ETL 4; T2-TSE, TE 100 ms, TR 4000 ms, ETL 8; FLAIR=T2-TSE with inversion recovery; TR 10000 ms; diffusion SE-EPI, TE 70 ms, TR 3 s; all having 24 slices, at 6 mm thickness. In order to outline a scanning region geometrically, i.e. the ROI 2b, the control unit 7 uses predefined scan geometries provided by the geometry unit 11, as will be described below.

In the image processing unit 8, the control system 5 further comprises an image processor element 8.1, an image buffer element 8.2, and an archive element 8.3. By means of these elements the image processing unit 8 is adapted for temporarily storing the NMR image data received by the control unit 7, for performing standard image processing procedures, e.g. Fourier transformation, thus deriving a particular desired image data format, and for storing the latter quasi permanently for archiving purposes. As the received image data is generally obtained by scanning an extended region inside the patient 2, said data buffering and processing for to produce a desired scan image is also referred to as scan reconstruction. In this context, the term "scan" may either comprise a single scanning pass or a time series of a plurality of scanning passes, such as in fMRI.

In the registration unit 9, the control system 5 further comprises a registration processor element 9.1 and a memory element 9.2, which are conjunctively operative to register scans relative to each other, i.e. to compare different scan images and to derive from said comparison information as to a deviation between the scan images. In accordance with the present invention the registration unit 9.1 is adapted for the relative registration of scans with different MR parameters and contrasts (see above).

The PMC unit 10 comprised in the control system 5 is adapted for prospective motion control with respect to a modification of scan parameters during a time-sliced acquisition of image data, i.e. within a time series constituting a single scan, as generally known for instance from prior art document WO 01/84172 A1 or CA 2 473 963 A1. To this end the MRI system 1 according to the present invention may further comprise external position determining means 14 in operative connection with both the examination chamber 3 and the control system 5, e.g. camera means, for measuring a position of the patient 2. Otherwise, PMC can be performed using orbital MR navigator signals or fiducial markers, as known to a person skilled in the art.

In the user console 12, the MRI system 1 in accordance with the present invention further comprises a console processor element 12.1 for controlling input means 12.2 and output means 12.3, e.g. a keyboard/mouse and a display screen, respectively, by means of which the user 13 can influence system operation and view the acquired image data, respectively.

In the geometry unit 11, the control system 5 further comprises a geometry processor element 11.1 and a memory element 11.2 for storing said scan geometry. Owing to suitable programme code comprised in the memory element 11.2 the geometry unit 11 includes geometry generating means 11.3 for generating a particular scan geometry, i.e. a particular scan orientation, geometry transformation generating means 11.4, and geometry updating means 11.5. In accordance with the present invention, by means of the geometry unit 11—which operates as a scan geometry planning unit—the MRI system 1 is adapted to predefine scan geometries to be shared by a plurality of different scanning scenarios in terms of MR parameters and contrasts, as generated by the control unit 7, and to provide these geometries to the control unit 7 for to accordingly elicit NMR signals from the patient 2 by adaptation of one or several scan parameters. These geometries have already been referred to as "shared geometries". The existence of such geometries is particularly useful when the same ROI 2b has to be scanned repeatedly with different MR parameters and contrast settings. From a software-engineering point of view, the (predefined) geometries thus exist independent from the scan parameters. If a scan queue is used, then an update of geometries triggers a revalidation of all the scans waiting in the queue.

In the above description of FIG. 1 an exemplary embodiment of an MRI system in accordance with the present invention has been described, knowing that in practise some of its functional units, e.g. units 7-11, may be arranged differently. In particular, data processing capacities may be shared between processor elements thus reducing the total number of such processor elements. For instance, the registration unit 9, PMC unit 10, and geometry unit 11 may effectively form a single unit with one processor element and an associated memory element. Otherwise, the geometry transformation generating means 11.4 may be part of the registration unit 9 (as illustrated in FIG. 1 by means of a dashed box referenced 9.3). Other such modifications will be devisable by a person skilled in the art.

If the patient 2 moves (involuntarily) between two programmed scans to be performed under control of the control unit 7, which share the same predefined geometry, i.e. which are aimed at recovering data from a common ROI 2b, then there would generally result a geometrical mismatch of the acquired ROI with respect to subsequent scans if the predefined scan geometry were never updated. In accordance with the present invention, by means of a suitable programme code comprised in the memory element 7.4 of the control unit 7, the MRI system 1 is first controlled to perform a number of scouting scans, i.e. retrieve image data from the patient 2, which can be used to define a desired ROI 2b in terms of scan geometries or scan orientations $O_p$. To this end, the user 13 analyses the scout images using the output means 12.3 and enters orientation definition data using the input means 12.2. The corresponding orientations $O_p$ are generated in the geometry generating means 11.3 and may either be stored in the memory element 7.4 of the control unit 7 or—alternatively or additionally—in the memory element 11.2 of the geometry unit 11 in the form of predefined scan geometries (named geometries), which are intended for acquiring NMR image data from at least one desired region of interest 2b relative to the patient 2. Based on the orientations $O_p$ the control unit 7 defines the corresponding scan parameters and subsequently submits the scan, i.e. performs the necessary operations to send the required control signals to the MR examination chamber 3 and the magnet/coil device 4. As stated before, some of the aforementioned functionalities may alternatively be performed by means of different functional units than those mentioned above, e.g. definition of scan parameters using $O_p$ might be performed in the geometry unit 11 by means of the processor element 11.1 comprised therein prior to submitting the scan, i.e. the corresponding parameter set, to the control unit 7. However, functional separations of this kind are only applicable to embodiments of the present invention, in which said functional units 7-11 are devised as separate physical entities, which is a merely optional characteristic of the inventive MRI system 1.

After submission of a given scan k, the corresponding image (or a series of image frames in the case of a time-sliced acquisition) is acquired, and reconstruction is performed in the image processing unit 8, as described above. The reconstructed image or image frames can then be written to a database by using the archive element 8.3 comprised in the image processing unit 8. However, said archive element 8.3 may alternatively or additionally be arranged externally of the control system 5, and may comprise any type of storage device known to a person skilled in the art, e.g. a tape drive, a CD-ROM drive, or a DVD-ROM drive. In parallel to said archiving process, in the registration unit 9 image data from the present scan k is registered relative to a scan j acquired earlier, based on the same scan orientation $O_p$, i.e. the same predefined geometry. Alternatively, instead of said earlier scan j suitable reference data, e.g. retrieved using the patient position determining means 14, may be used for comparison, and accordingly another dedicated position detection is performed in conjunction with scan k. The result of the registration/comparison is then employed to derive the transformation matrix T using the geometry transformation generating means 9.3, 11.4, which is indicative of the geometrical mismatch of the ROI 2b between subsequent scans j, k. The matrix T is subsequently employed by the geometry updating means 11.5 to update the predefined scan orientation/geometry $O_p$: $O_p'=O_p*T$, wherein "*" denotes a multiplication of matrices, if T is sufficiently non-zero, as stated above. To this end, predetermined or user defined threshold values can be stored in a suitable memory element, e.g. memory element 11.2, which are compared to the elements of T using the processor element 11.1, for instance. Since the patient motion generally affects all of the predefined geometries, the transformation should preferably be applied to every predefined scan geometry stored in the respective memory elements 7.4, 11.2. The updated scan geometries are then used to define new scan parameters for the next scan to be submitted, and so forth until all scans to be performed are finished.

Thus, in accordance with the present invention an analogue to prospective motion correction is implemented between scans in MRI system operation with named geometries by:
performing an anatomy scouting scan,
planning the region of interest, i.e. named geometries,
performing a set of scans sharing a given geometry, and
upon reconstruction of every scan, analysing the position of the region of interest and updating the geometry prescription of the subsequent scan according to a deviation of the measured ROI position from the planned ROI position.

As described above, a dedicated position detection can be performed in conjunction or instead of both the scouting scan (reference scan) and for subsequent scans, and the predefined scan geometries are updated on the basis of detected orientation changes. Additionally, within acquisition of a time-sliced scan, standard PMC can be employed by the PMC unit 10 to further enhance correctness of ROI position.

Figure 2:
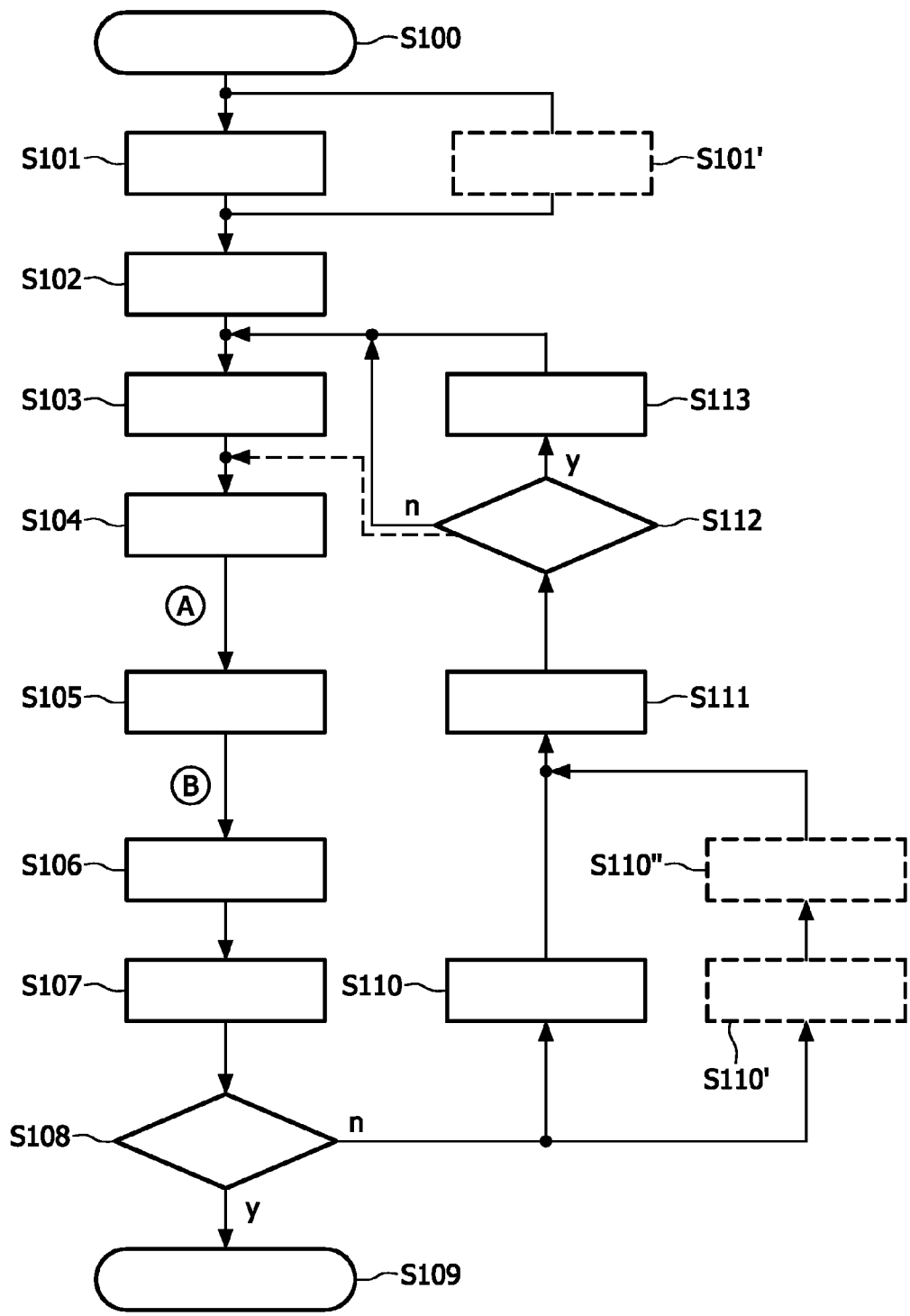
FIG. 2 is a flow chart of a first embodiment of the method according to the present invention.

FIG. 2 shows a flow chart illustrating the method for acquiring image data from a patient with a magnetic resonance imaging (MRI) system, in particular with the above-described system 1, in accordance with the present invention. The method commences with step S100. In a subsequent step S101, a scouting scan is performed to acquire scout images which can be used for defining a desired ROI. As an alternative to said step S101, a dedicated position detection can be performed in step S101', which is illustrated by means of a dashed box in FIG. 2. On the basis of either the scout images or the position detection the user is prompted to define a number of scan orientations $O_p$ in a following step S102, which are stored as predefined scan geometries for geometry sharing purposes, as explained in detail with reference to FIG. 1 above. In a subsequent step S103, scan parameters are defined using the scan orientations $O_p$. Then, in step S104 a given scan, hereinafter referred to as scan k, is submitted to the control unit 7 (FIG. 1), which actually initiates and controls data acquisition by issuing suitable control signals to its own subunits, e.g. transceiver element 7.2 and pulse generator element 7.3, and to the examination equipment, e.g. the magnet/coil device 4 (FIG. 1). Subsequent step S105 includes the actual image acquisition for said given scan k, i.e. receiving corresponding NMR data from the patient 2, which is buffered in the image processing unit 8 (cf. FIG. 1). In a following step S106, the scan is reconstructed, as previously described. The reconstructed scan image is written to a database in subsequent step S107. Then, in step S108 it is determined whether or not all programmed scans have been performed. If this is the case (y), then the method terminates with step S109. Otherwise (n) in subsequent step S110, scan k is registered relative to a scan j, which was acquired earlier. However, scans j, k share the same predefined scan geometry, i.e. ideally they are acquired from the same ROI. Then, in step S111 the transformation matrix T is determined from the registration result in step S110, i.e. a measured deviation or mismatch of the actual ROI with respect to the planned ROI. If the matrix T is found to be sufficiently non-zero in subsequent step S112 (y), then in a following step S113 the predefined scan orientations $O_p$ are updated using T, i.e. $O_p'=O_p*T$, and the method is repeated starting with step S103, wherein $O_p'$ is substituted for $O_p$. Otherwise, the scan parameters are again defined based on $O_p$ in step S103, such that a number of earlier defined parameters could effectively be reused, as indicated by a dashed arrow in FIG. 2.

As an alternative to the above-described step S110, in conjunction with said alternative step S101' the method according to the invention may comprise a further step S110' of performing another dedicated position detection for every given scan k, which in subsequent alternative step S110" is compared with the dedicated position detection acquired in step S101' to predefine the scan orientations $O_p$ (see above). As pointed out before, the result of this comparison may be used in step S111 to derive the transformation matrix T, and subsequently update the predefined scan orientations $O_p$.

In addition to the inter-scan motion correction described above, prospective motion correction PMC can be used in any scan k, i.e. within the scope of step S105 (FIG. 2), having multiple time-sliced acquisitions, hereinafter referred to a image frames N, N=1, 2, 3, . . . , which are equal in terms of MR parameters and contrasts as defined in step S103 (FIG. 2). This is detailed in FIG. 3.

Figure 3:
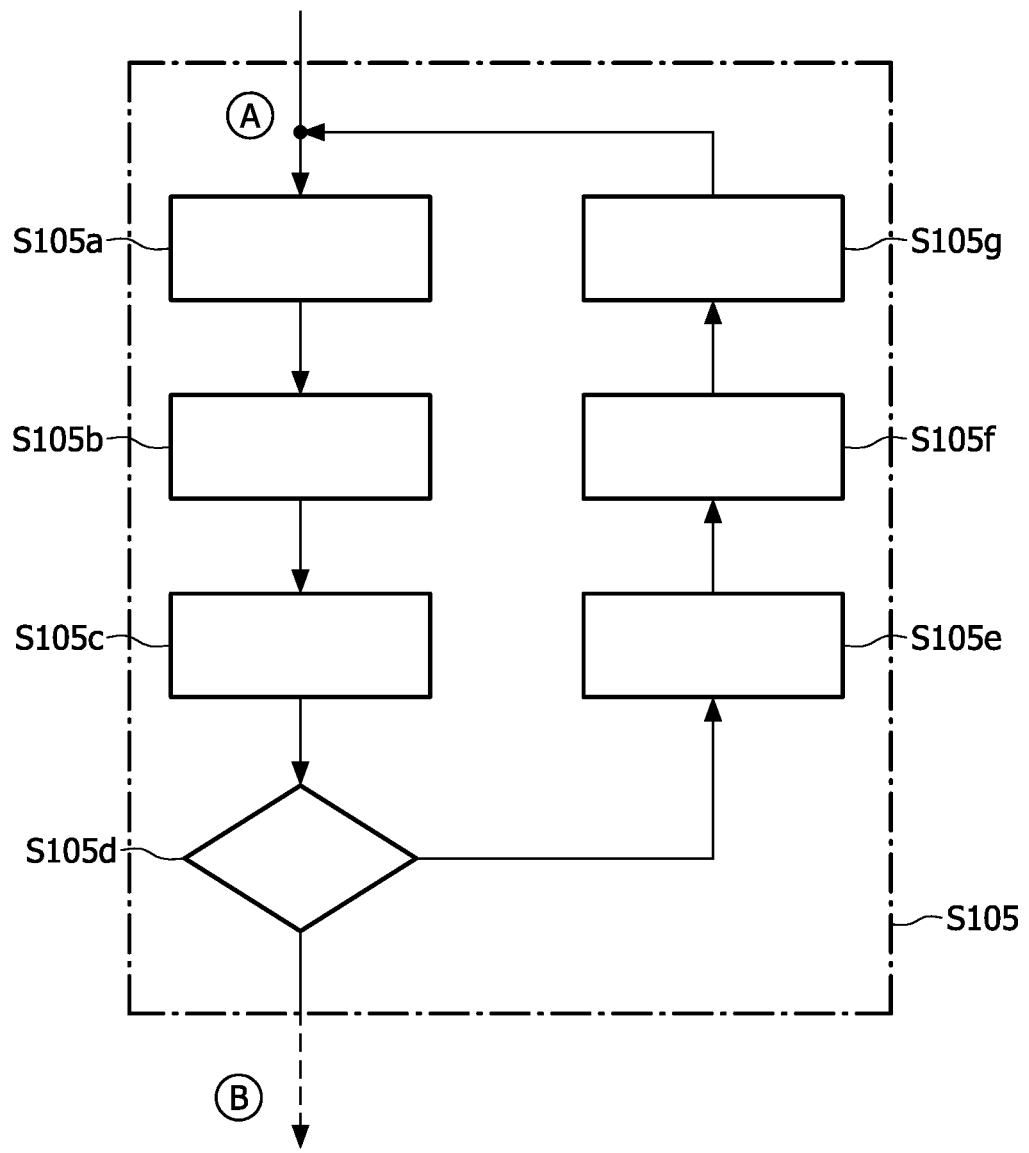
FIG. 3 is a flow chart of a second embodiment of the method according to the present invention.

FIG. 3 shows a flow chart of another embodiment of the method according to the present invention, which serves as an extension of step S105 as described earlier with reference to FIG. 2 (cf. reference numerals A, B in FIGS. 2 and 3). In step S105a, an image frame N is acquired. Said image frame N is reconstructed in subsequent step S105b and written to the database in step S105c, whereupon in step S105d it is determined whether or not the present scan k is finished. If this is the case (y), then the method continues with step S106 as previously described with reference to FIG. 2. Otherwise (n), in step S105e the presently acquired image frame N is registered versus an image frame N−1 acquired earlier in the time series, and a transformation matrix T' is derived in subsequent step S105f. Matrix T' takes into account a mismatch or deviation of said image frames N−1, N due to patient motion during the time series. Then, in step S105g the matrix T' is applied locally to update the scan parameters only for a subsequent image frame N+1, whereupon the method is repeated from step S105a until said scan k is finished. Then, the method continues with step S106 as previously described with reference to FIG. 2.

Thus, the present invention provides a method for acquiring image data from a patient with an adapted magnetic resonance imaging (MRI) system which obviates the disadvantage that due to patient motion subsequent scans with a common predefined "named geometry" effectively acquire data from different regions in the patient, which usually do not coincide with an intended ROI. In this way, the utility of such predefined scan geometries is greatly enhanced.

The invention claimed is:

1. A method for acquiring image data from a patient with a magnetic resonance imaging system, comprising the steps of:
   a) predefining a scan geometry for acquiring the image data from at least one region of interest relative to the patient,
   b) storing a plurality of scans to be performed in a memory of a controller of a magnetic resonance scanner, the scans to be performed of the region of interest using the defined scan geometry, each scan including a plurality of frames,
   c) with the controller, controlling the magnetic resonance scanner to perform each of the scans stored in the memory using the defined scan geometry and including:
      1) for each scan after a first one, sequentially acquiring resonance data for each frame,
      2) reconstructing the resonance data for a Nth frame into a Nth frame image, where N is a positive integer,
      3) registering the Nth frame image with a reference frame image to determine a geometry defined transformation matrix, the reference frame image determined from the plurality of scans and being indicative of a dedicated position detection of the scan geometry,
      4) correcting the defined scan geometry with the transform matrix when a deviation as measured by the transform matrix exceeds a predetermined threshold,
      5) repeating steps c1-c4 for a plurality of subsequent frames.

2. The method according to claim 1, wherein step c3 further comprises applying said geometry transformation matrix to the defined scan geometry.

3. The method according to claim 1, wherein the geometry transformation matrix is derived by registering the Nth frame image relative to an anatomical reference.

4. The method according to claim 1, wherein an anatomy scouting scan is performed prior to step b) to generate a scout image for detecting anatomical landmarks of the patient, and in that the region of interest is defined relative to said anatomical landmarks.

5. The method according to claim 1, wherein a dedicated position detection is performed prior to step a) for detecting a position of the patient, and in that the region of interest is defined relative to said patient position.

6. The method according to claim 5, wherein said dedicated position detection comprises at least one of using an orbital MR navigator, using fiducial markers, and using external optical detection means.

7. A magnetic resonance imaging system, comprising:
   a magnet/coil device for subjecting a patient to a magnetic field and for acquiring image data from the patient, and
   a control system in connection with the magnet/coil device, said control system which in one imaging session includes a processor configured to control the magnet/coil device to:
      perform a set of diagnostic imaging scans sharing a selected scan geometry and acquire diagnostic image data from each of the diagnostic imaging scans, each of the diagnostic imaging scans registered with a reference frame image, the reference frame image determined from the set of diagnostic imaging scans and being indicative of a dedicated position detection of the selected scan geometry,
      analyze the diagnostic image data from a plurality of the diagnostic imaging scans to detect deviations from the selected scan geometry,
      in response to any of the deviations being determined to exceed a pre-determined value, changing the scan geometry before acquiring a remaining portion of the diagnostic image data.

8. The system according to claim 7, wherein the control system within a single imaging session further:
   registers image data from a first scan of the set of scans relative to image data from a second scan of the set of scans,
   from said registration, derives a transformation, and
   changes scan geometry based on the derived transform.

9. The system according to claim 7, wherein the control system further:
   reconstructs the diagnostic image data into diagnostic images;
   registers the diagnostic images from at least one of the scans relative to an anatomical reference,
   derives from said registration a transformation, and
   uses the transform to change the scan geometry for subsequent scans.

10. The system according to claim 7, comprising dedicated position detection system different from the magnet/coil device for detecting a position of the patient.

11. The system according to claim 7, wherein at least one scan of the set of scans includes a time series of image frame acquisitions and wherein the controller detects the deviations a plurality of times during the time series of frame image acquisitions.

12. The system according to claim 7, wherein the controller system includes:
   a memory which stores a plurality of predefined scan geometries; and
   a user input by which a user selects one of the predefined scan geometries.

13. A non-transitory computer-readable medium carrying software for controlling one or more processors to perform the method of claim 1.

14. A magnetic resonance imaging system comprising:
   a magnet/coil device which subject a patient to a magnetic field and acquires image data from the patient;
   one or more processors in connection with the magnet/coil device programmed to control the magnet/coil device to perform the method according to claim 1.

15. A method for acquiring image data from a patient with a magnetic resonance imaging (MRI) system, the method comprising:
   a) performing a scout scan to acquire scout images which include a desired region of insterest;
   b) defining a plurality of scan geometries;
   c) storing the defined scan geometries,
   d) defining scan parameters using the defined scan geometries,
   e) controlling the magnetic resonance imaging system with the defined scan parameters to perform a plurality of image acquisitions,
   f) receiving corresponding resonance data from the patient during a one imaging acquisition and reconstructing the received resonance data into a reconstructed scan image;
   g) registering a reconstructed scan image with a reference scan image determined from the scout scan to determine a transform matrix based on a deviation or mismatch of the regions of interest in the reconstructed scan image and a previous scan image, the reference scan image being indicative of a dedicated position detection of a respective scan geometry;

h) updating the defined scan geometry using the transform matrix when a deviation as measured by the transform matrix exceeds a predetermined threshold;

i) repeating steps e)-h).

\* \* \* \* \*